(12) United States Patent
Gershtenman-Avsian et al.

(10) Patent No.: US 11,063,159 B2
(45) Date of Patent: Jul. 13, 2021

(54) METHODS FOR ROUTING ELECTRICAL INTERCONNECTIONS AND RESULTANT STRUCTURES

(71) Applicant: FLIR Systems, Inc., Wilsonville, OR (US)

(72) Inventors: Hagit Gershtenman-Avsian, Huntersville, NC (US); Andrey Grinman, Charlotte, NC (US); Alexander Feldman, Los Altos, CA (US); Alan D. Kathman, Charlotte, NC (US); David Ovrutsky, Charlotte, NC (US)

(73) Assignee: FLIR Systems, Inc., Wilsonville, OR (US)

( * ) Notice: Subject to any disclaimer, the term of this patent is extended or adjusted under 35 U.S.C. 154(b) by 49 days.

(21) Appl. No.: 16/360,152

(22) Filed: Mar. 21, 2019

(65) Prior Publication Data
US 2019/0221679 A1    Jul. 18, 2019

Related U.S. Application Data

(63) Continuation of application No. PCT/US2017/054345, filed on Sep. 29, 2017.

(60) Provisional application No. 62/403,390, filed on Oct. 3, 2016.

(51) Int. Cl.
*H01L 31/0203* (2014.01)
*H01L 23/10* (2006.01)
*H01L 23/28* (2006.01)
*H01L 31/02* (2006.01)

(52) U.S. Cl.
CPC .......... *H01L 31/0203* (2013.01); *H01L 23/10* (2013.01); *H01L 23/28* (2013.01); *H01L 31/02005* (2013.01)

(58) Field of Classification Search
CPC ..... H01L 31/0203; H01L 23/10; H01L 23/28; H01L 31/02005; H01L 31/048
USPC .......................................................... 257/434
See application file for complete search history.

(56) References Cited

U.S. PATENT DOCUMENTS

| | | | |
|---|---|---|---|
| 6,777,767 B2 * | 8/2004 | Badehi ................. | B81B 7/0067 257/414 |
| 7,807,508 B2 * | 10/2010 | Oganesian ........ | H01L 27/14683 438/114 |
| 2008/0029879 A1 | 2/2008 | Tuckerman et al. | |
| 2008/0099907 A1 | 5/2008 | Oganesian et al. | |
| 2013/0248686 A1 * | 9/2013 | Tohyama ................. | G01J 5/20 250/208.1 |

(Continued)

*Primary Examiner* — Vu A Vu
(74) *Attorney, Agent, or Firm* — Haynes and Boone, LLP

(57) ABSTRACT

An optoelectronic device package includes an optoelectronic device having an active region on a first surface of a substrate, a bond pad area on the first surface that includes at least one contact pad electrically connected to the active region, and a cap having a first cap surface and a second cap surface, the first cap surface being secured to the first surface of the substrate, the cap covering the optoelectronic device. At least one of the cap and the substrate has an angled sidewall extending at an angle relative to an axis parallel to an optical path. The at least one contact pad is exposed by and adjacent to the angled sidewall. An electrical line extends from each of the at least one contact pad along the angled sidewall and to the second cap surface that does not overlap the active region.

20 Claims, 15 Drawing Sheets

(56) References Cited

U.S. PATENT DOCUMENTS

2016/0011054 A1   1/2016   Massetti

* cited by examiner

METHODS FOR ROUTING ELECTRICAL INTERCONNECTIONS AND RESULTANT STRUCTURES

CROSS-REFERENCE TO RELATED APPLICATIONS

This application is a continuation of International Patent Application No. PCT/US2017/054345, filed on Sep. 29, 2017, and entitled: "Methods for Routing Electrical Interconnections and Resultant Structures," which is incorporated herein by reference in its entirety.

International Patent Application No. PCT/US2017/054345 claims priority to and the benefit of U.S. Provisional Patent Application No. 62/403,390, filed on Oct. 3, 2016, and entitled: "Methods for Routing Electrical Interconnections and Resultant Structures," which is incorporated herein by reference in its entirety.

BACKGROUND

1. Field

Example embodiments relate to methods for routing electrical interconnections and resultant structures, particularly for an optoelectronic device for use with the thermal infrared (TIR) region (mid-wavelength infrared (MWIR) and long wavelength infrared (LWIR) region), and associated methods.

2. Description of the Related Art

Optoelectronic devices that source, detect, and control electromagnetic radiation may be formed on a wafer level which include a cap, e.g., a structure that seals and protects elements therein, provided with vertical walls, e.g., resulting from separation using a straight dicing blade. However, such a structure may require a substantial space margin between the bond pads and the edge of the cap in order to have free access to electrical connections extending between the cap and an electrical pad associated with the elements protected by the cap.

BRIEF DESCRIPTION OF THE DRAWINGS

Features will become apparent to those of skill in the art by describing in detail example embodiments with reference to the attached drawings, in which.

DETAILED DESCRIPTION

Figure 1:
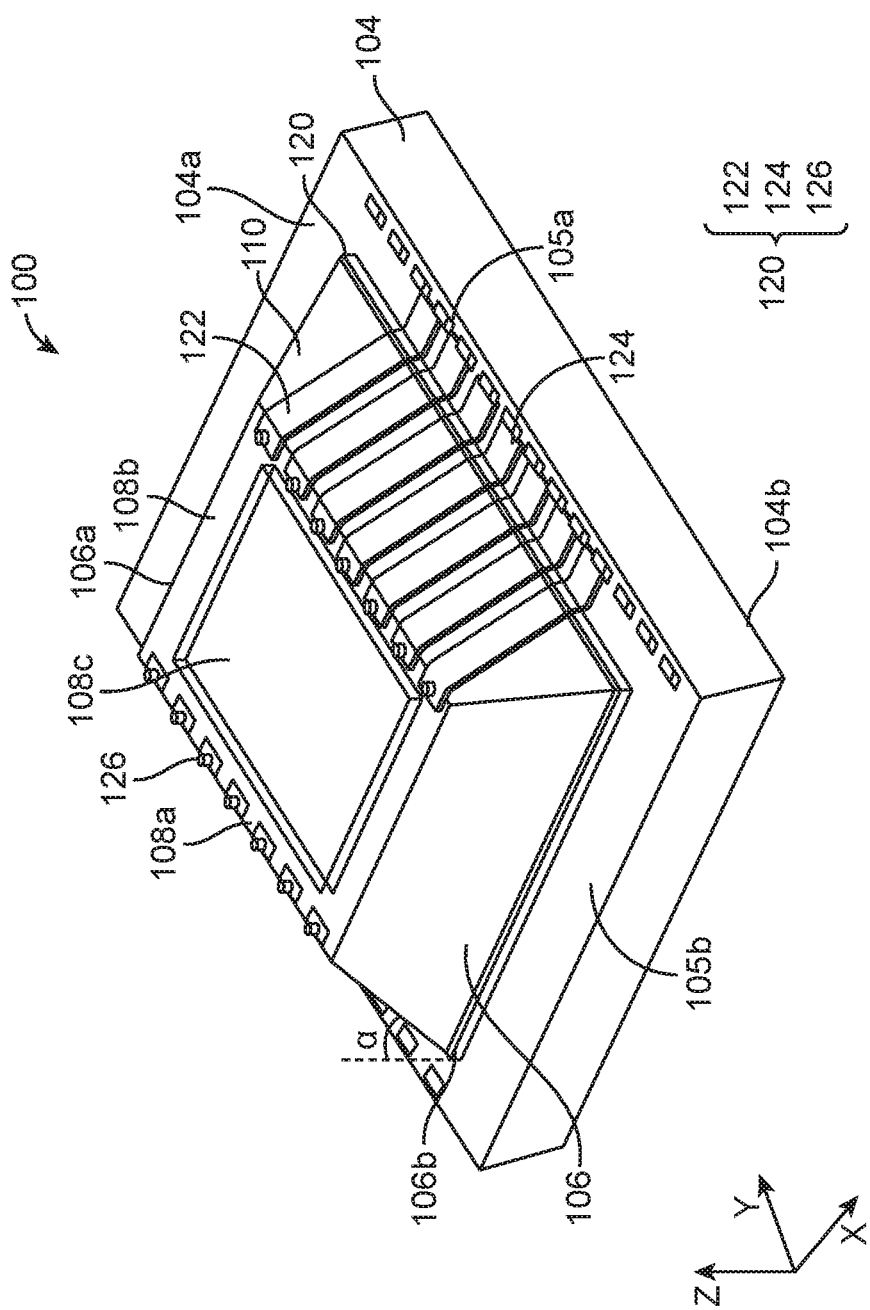
FIG. 1 illustrates a perspective view of an optoelectronic device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. Like reference numerals refer to like elements throughout.

In the drawings, the thickness of layers and regions may be exaggerated for clarity. It will also be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout. As used herein, the term "wafer" is to mean any substrate on which a plurality of components are formed on a planar surface which are to be separated through the planar surface prior to final use. Dashed lines extending in the drawing figures are to indicate that a substrate is part of a wafer.

FIG. 1 illustrates a perspective view of an optoelectronic chip 100 in accordance with an embodiment. According to the present example embodiment, the optoelectronic chip 100 includes an optoelectronic device 102, e.g., a microbolometer, on a substrate 104 and a cap 106 hermetically sealing the optoelectronic device 102. The substrate 104 may include a first surface 104a and a second surface 104b spaced apart from the first surface 104a along a direction of an optical path in the optoelectronic chip 100, i.e., along the z-axis. The cap 106 may include a first surface 106a and a second surface 106b spaced apart from the first surface 106a along a direction of an optical path in the optoelectronic chip 100, i.e., along the z-axis. The cap 106 may include a recess therein to overlap the optoelectronic device 102 (as discussed in detail with reference to the recess 207 in FIG. 7C). The recess in the cap 206 may allow all electrical interconnections 120 between the optoelectronic device 102 to another element to be routed along the substrate 104 itself.

The cap 106 may have tapered sidewalls 110 that extend from the first surface 106a to the second surface 106b adjacent the substrate 104, e.g., the second surface 106b may face and be secured to the first surface 104a of the substrate 104. The first surface 106a may be smaller than the second surface 106b, e.g., along at least one direction (plus or minus relative to a center of the optoelectronic device 100) of at least one of the x and y axes, such that at least one sidewall 110 extending therebetween may have an angle α relative to the z-axis greater than 0 and less than 90 degrees, e.g., about 15 degrees, about 30 degrees, about 45 degrees, or about 60 degrees. The tapered sidewalls create several packaging advantages for the subsequent assembly of the optoelectronic device and connection to an electronic circuit.

The first surface 106a may include bonding regions 108a, connecting regions 108b extending between the bonding regions 108a, and a transparent opening 108c in a central region thereof allowing light (e.g., visible, infrared, and so forth) for use with the optoelectronic device 102 to pass therethrough. The bonding regions 108a and the connection regions 108b may be opaque to light for use with the optoelectronic device 102. The second surface 106b may cover the optoelectronic device 102 while still exposing bonding platforms 105a of the substrate 104.

The bonding regions 108a may include two bonding regions 108a on opposite sides of the first surface 106a, e.g., the bonding regions 108a may be spaced apart from one another along the x-axis. The connecting regions 108b may extend along the x-axis, may be spaced from one another along the y-axis, and may connect the bonding regions 108a to one another.

Alternatively, one or both of the connecting regions 108b could be replaced with a bonding region 108a, e.g., the bonding regions 108a could be a singular, continuous bonding region that completely surrounds the transparent region 108c. Further alternatively, one of the bonding regions 108a may simply be a connecting region 108b or part of the transparent region 108c. Further alternatively, any connecting region 108b may have a straight sidewall between the first surface 106a and the second surface 106b.

Bonding platforms 105a on the first surface 104a of the substrate 104 may correspond to the bonding regions 108a of the cap 106, e.g., may be aligned along the y-axis, but spaced apart along the z and x axes. While the first surface 104a of the substrate 104 is illustrated as having planar areas exposed beyond the cap 106 on all four sides, the cap 106 at least exposes the bonding platforms 105a on either side of the cap 106. Alternatively, all exposed planar areas on the substrate 104 could be a bonding platform 105a, e.g., a singular, continuous bonding platform. Further alternatively, one of the bonding platforms 105a may simply be a connecting region 105b. In other words, the cap 106 has at least one sidewall 110 that exposes at least one bonding platform to be electrically connected to at least one bonding region 108a, as described below.

Electrical interconnections 120 may be routed between the bonding regions 108a and the bonding platforms 105a along the sidewalls 110. The electrical interconnections 120 may include a plurality of electrical interconnections 120 spaced apart, e.g., along the y-axis. The electrical interconnections 120 may include ball grid array (BGA) interconnects 126 in the bonding regions 108a, contact pads 124 connected to the optoelectronic device 102 on bonding platforms 105a of the substrate 104, and electrical lines 122 extending between the contact pads 124 and the interconnects 126 along the sidewalls 110 of the cap 106. The BGA interconnects 126 may include a plurality of interconnects 126 spaced apart, e.g., along the y-axis. The electrical interconnections 120 may connect the optoelectronic device 102 to additional elements, e.g., a printed circuit board 150 (see FIG. 6).

Figure 2:
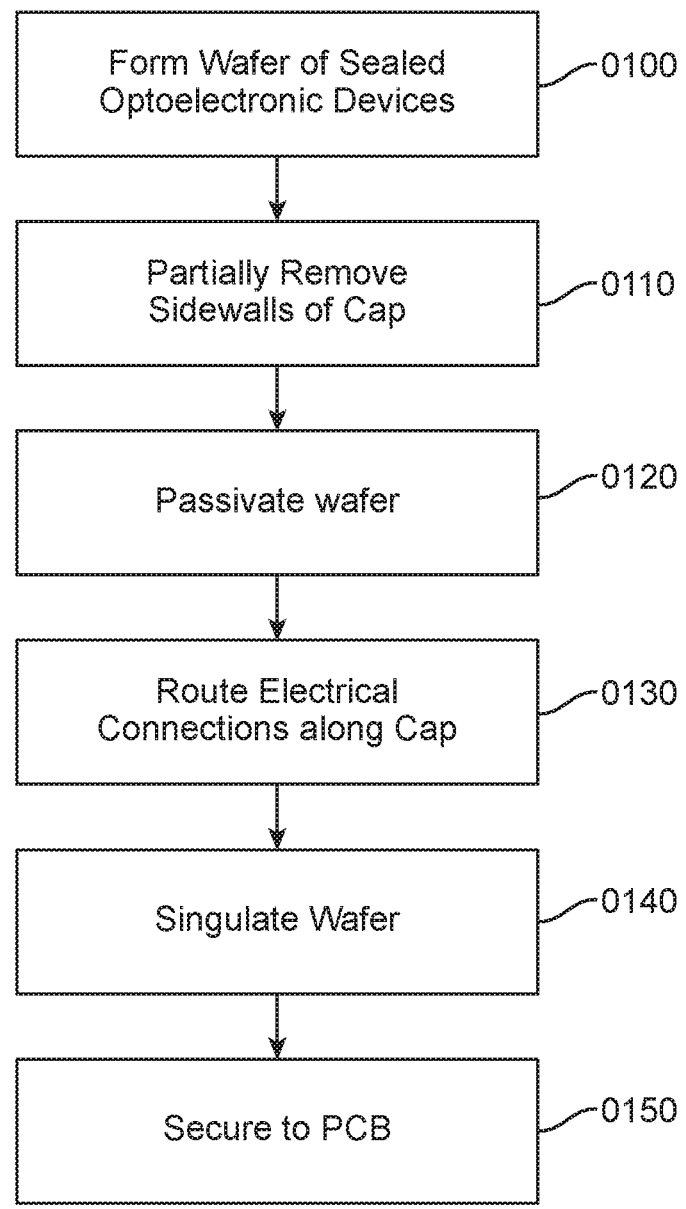
FIG. 2 illustrates a flowchart of a method for manufacturing the optoelectronic device of FIG. 1.

FIG. 2 illustrates a flowchart of a method of creating the optoelectronic chip 100 on a wafer level according to an example embodiment. FIGS. 3 to 6 illustrate perspective views in stages of the method of FIG. 2. It is noted that while a wafer 180 accommodates a plurality of optoelectronic devices 102, FIGS. 3 to 6 only illustrate a portion of the wafer 180 that corresponds to a single optoelectronic device 102 for clarity.

Figure 3:
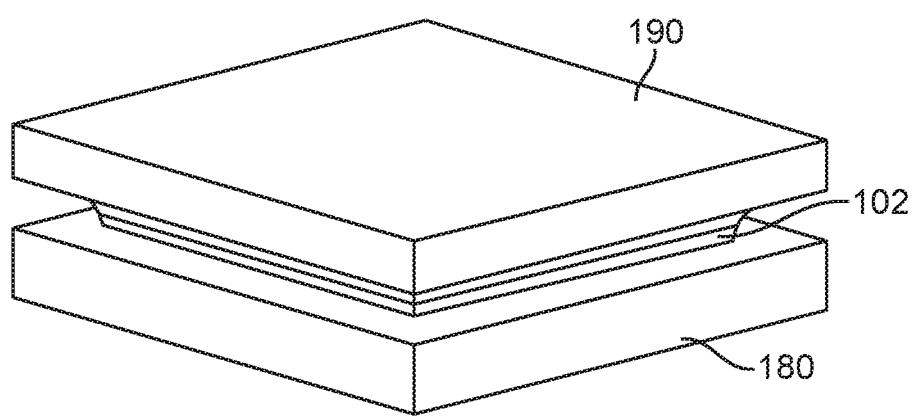
FIGS. 3 to 6 illustrate perspective views of stages of the method of FIG. 2.

First, in operation o100, a plurality of optoelectronic devices 102 on the wafer 180 may be secured with a cap wafer 190, as illustrated in FIG. 3. This securing protects the optoelectronic device 102, e.g., hermetically seals the optoelectronic device 102. This may be realized using a bonding wafer, an adhesive material, or, if both the wafer 180 and the cap wafer 190 are silicon (Si), through silicon to silicon bonding. Thus, the optoelectronic device during subsequent operations described below.

Figure 4:
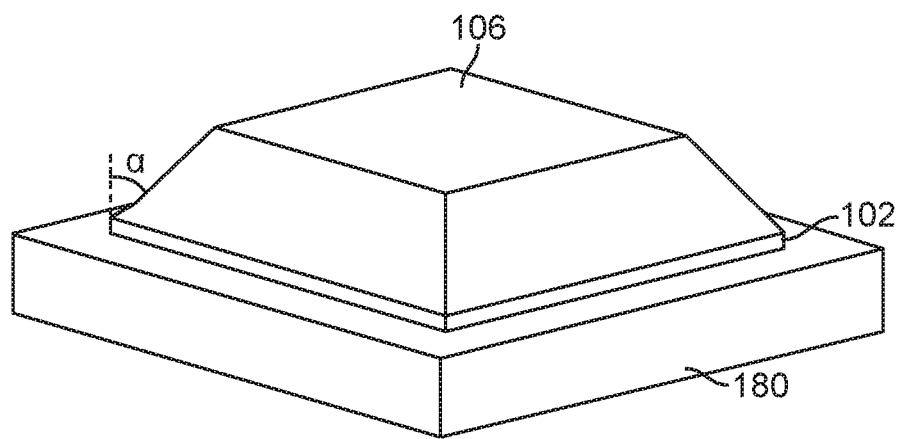
Figure 5:
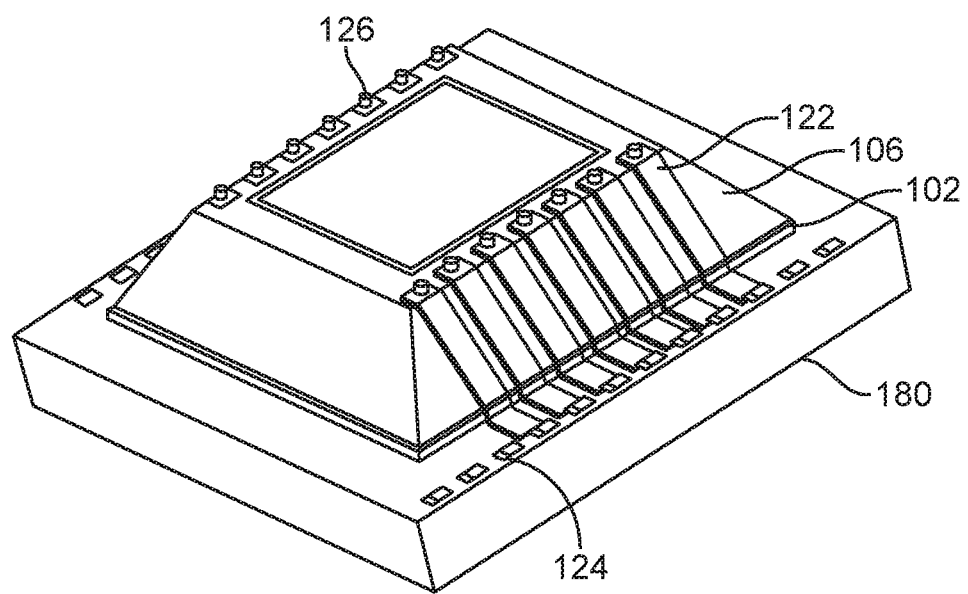

Then, in operation o110, the cap wafer 190 may be partially removed, e.g., with a beveled dicing blade or etching, around a perimeter of the optoelectronic devices 102 to form individual caps 106 from the cap wafer 190, e.g., in a one-to-one ratio, while the wafer 180 remains in wafer form, i.e., as an integral unit. In particular, as illustrated in FIG. 4, the cap 106 may have relieved edges, i.e., angled sidewalls 110 such that the cap 106 has a truncated pyramidal or frustum shape, e.g., each sidewall 110 of the cap 106 may have a trapezoidal shape extending from an edge of the first surface 106a to an edge of the second surface 106b. The angle α (as determined relative to the exposed surface of the substrate 104 or the z-axis) may be greater than 0 and less than 90 degrees, e.g., about 15 degrees, about 30 degrees, about 45 degrees, or about 60 degrees. The cap 106 may be monolithic and transparent to light to be used with the optoelectronic device 102 in the central region of surface 106a, which is located above the light-sensitive optoelectronic device 102. The obscuration due to the electrical traces in FIG. 5 is outside the area of interest and actually reduce the amount of stray radiation that can penetrate the package.

Figure 6:
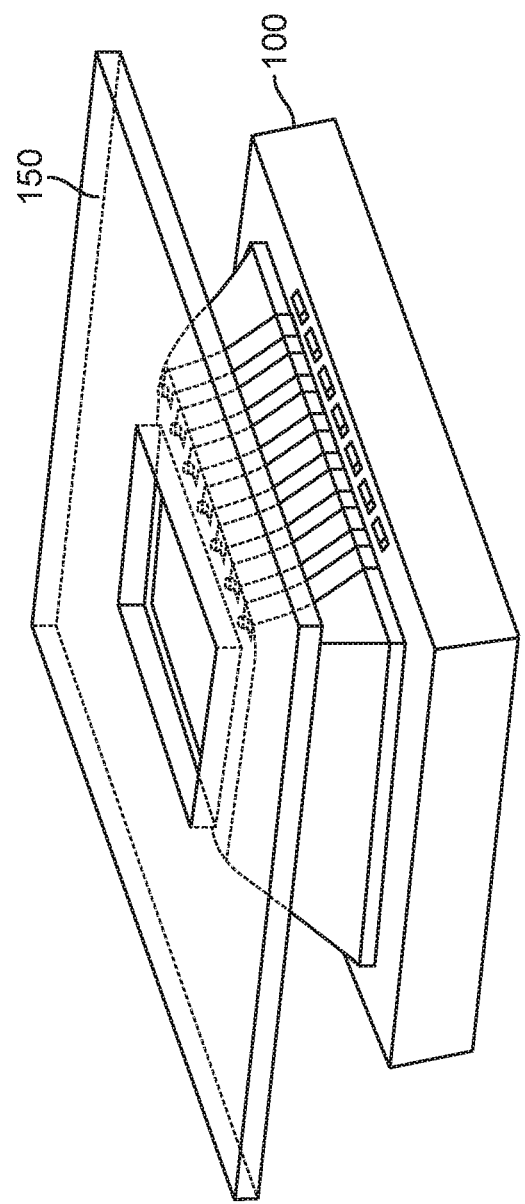

Then, in operation o120, the wafer 180 is passivated in the area where the electrical traces (shown in FIG. 5) will be applied. This passivation can take the form of a patterned polymer coating under the traces or a dielectrically insulating AR coating applied over the whole surface of wafer 180. To route electrical connections from the contact pad locations on surface 104a to BGA interconnect locations on surface 106a, requires a series of lithographic processes or precision printing processes. Then, using lithography and metal deposition or possibly metal printing processes, electrical lines 122 are formed along the sidewall 110 to connect the BGA interconnects locations 126 and the contact pads locations 124. Then, in operation o130, the BGA interconnects 126 are formed on each cap 106 and the contact pads 124 are formed on the wafer 104 adjacent each of the optoelectronic devices 102. In operation o140, the wafer 180 is singulated to form individual optoelectronic chips 100, as shown in FIG. 1. Then, the PCB, e.g., a perforated PCB 150 including an opening 152 transparent to the wavelengths of interest, is secured to the BGA interconnects 126 on the cap 106, as shown in FIG. 6. Alternatively, the PCB may be attached to the cap 106 before singulation, either as an individual PCB or as part of a PCB wafer.

Figure 7B:
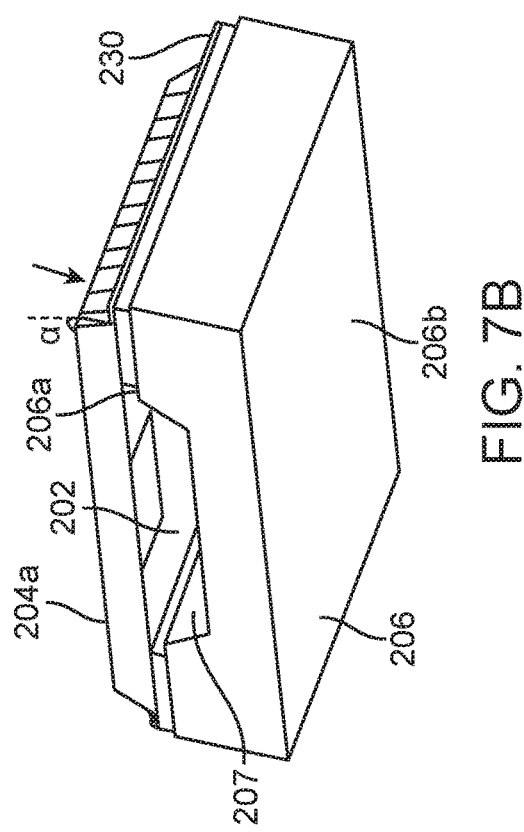
FIGS. 7B to 7D illustrate cross-sectional perspective views of an optoelectronic device according to the embodiment of FIG. 7A.
Figure 7D:
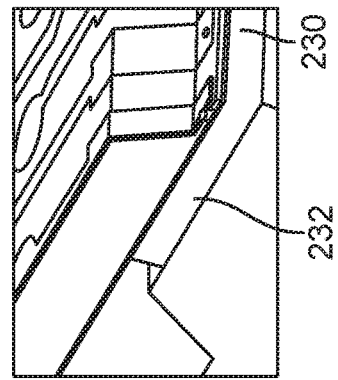
Figure 7A:
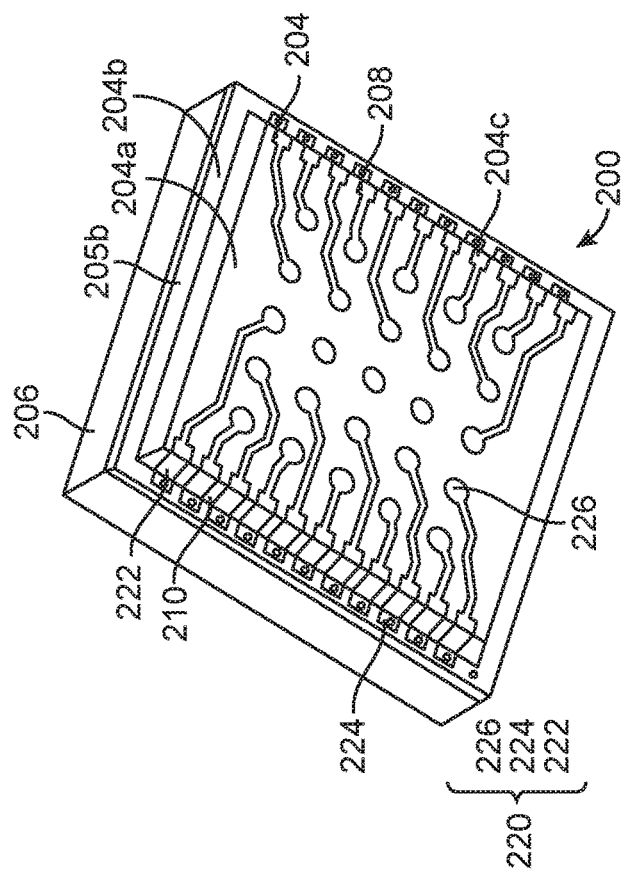
FIG. 7A illustrates a perspective view of an optoelectronic device according to an embodiment.
Figure 7C:
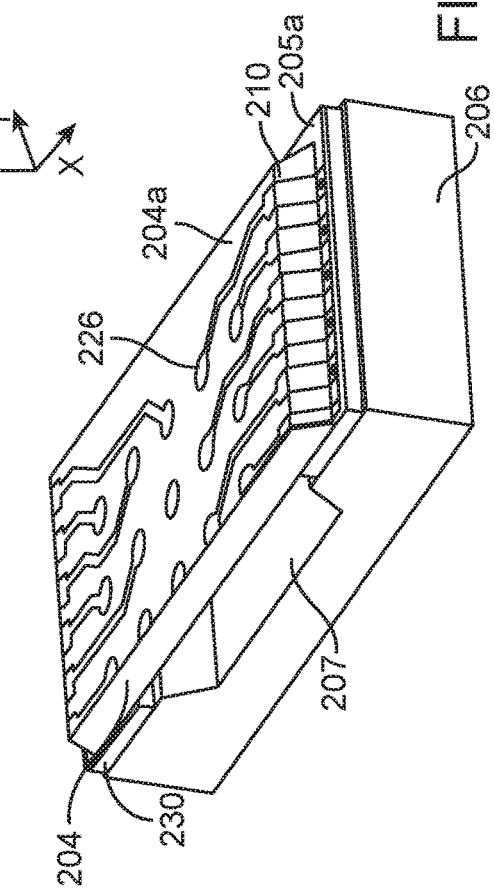

FIG. 7A illustrates a perspective view of an optoelectronic chip 200 in accordance with an embodiment. FIGS. 7B to 7D illustrates perspective cross-sectional (cut away) views of the optoelectronic chip 200 in accordance with an embodiment. As may be seen therein, the optoelectronic chip 200 includes an optoelectronic device 202, e.g., a microbolometer, on a substrate 204 and a cap 206 hermetically sealing the optoelectronic device 202. The cap 206 may be transparent to light for use with the optoelectronic device 202. A bonding material 230 may be interposed between the cap 206 and the substrate 204. The bonding material 230 may be opaque to light for use with the optoelectronic device 202.

The substrate 204 may include a first surface 204a and a second surface 204b spaced apart from the first surface 204a along a direction of an optical path in the optoelectronic chip 200, i.e., along the z-axis. The cap 206 may include a first surface 206a and a second surface 206b spaced apart from the first surface 206a along a direction of an optical path in the optoelectronic chip 200, i.e., along the z-axis.

The substrate 204 may have tapered sidewalls 210 that extend from the first surface 204a to a third surface 204c. The third surface 204c may be spaced apart along the z-axis from the second surface 204b adjacent the cap 206, e.g., secured to the first surface 206a of the cap 206. The first surface 204a may be smaller than the second and third surfaces 204b, 204c, e.g., along at least one direction (plus or minus relative to a center of the optoelectronic device 200) of at least one of the x and y axes, such that at least one sidewall 210 extending therebetween may have an angle relative to the z-axis greater than 0 and less than 90 degrees, e.g., about 15 degrees, about 30 degrees, about 45 degrees, or about 60 degrees.

The first surface 204a may serve as a bonding region 208. The third surface 204c of the substrate 204 exposed by the sidewalls 210 may include two bonding platforms 205a on opposite sides of the third surface 204c, e.g., are spaced apart from one another along the x-axis. Connecting regions 205b may extend along the x-axis, may be spaced from one another along the y-axis, and may connect the bonding platforms 205a to one another. Alternatively, one or both of the connecting regions 208b could be replaced with a bonding platform 205a, e.g., the bonding platforms 205a could be a singular, continuous bonding region that completely surrounds the optoelectronic device 202. Further alternatively, one of the bonding platforms 205a may simply be a connecting region 205b. Further alternatively, any connecting region 205b may have a straight sidewall between the first surface 204a and the second surface 204b.

While the third surface 204c of the substrate 204 is illustrated as having planar areas exposed beyond the first surface 204a on all four sides, the first surface 204a at least exposes the bonding platforms 205a on either side of the third surface 204c of the substrate 204. Alternatively, all exposed planar areas on the third surface 204c of the substrate 204 could be a bonding platform 205a, e.g., a singular, continuous bonding platform. Further alternatively, one of the bonding platforms 205a may simply be a connecting region 205b. In other words, the substrate 204 has at least one sidewall 210 that exposes at least one bonding platform 205a to be electrically connected to the bonding region 208, as described below.

The cap 206 may include a recess 207 therein to overlap the optoelectronic device 202. The recess 207 in the cap 206 may allow all electrical interconnections 220 between the optoelectronic device 202 to another element to be routed along the substrate 204 itself. For example, as shown in FIGS. 7A to 7D, electrical interconnections 220 may include the contact pads 224 connected to the optoelectronic device 202 on the bonding platforms 205a, the BGA interconnects 226 for connection to an external device on the bonding region 208, and electrical lines 222 extending from the BGA pads 226 along the sidewall 210 of the substrate 204 to the contact pads 224. The substrate 204 may have tapered sidewalls 210 having an angle α (as determined relative to the exposed surface of the substrate 204 or the z-axis) that may be greater than 0 and less than 90 degrees, e.g., about 15 degrees, about 30 degrees, about 45 degrees, or about 60 degrees. These tapered sidewalls 210 may allow the contact pads 224 to be exposed on the third surface 204c such that they may be readily connected to the BGA pads 226 on the first surface 204a along the substrate 204 itself, which may reduce an overall height of the device 200.

Figure 8:
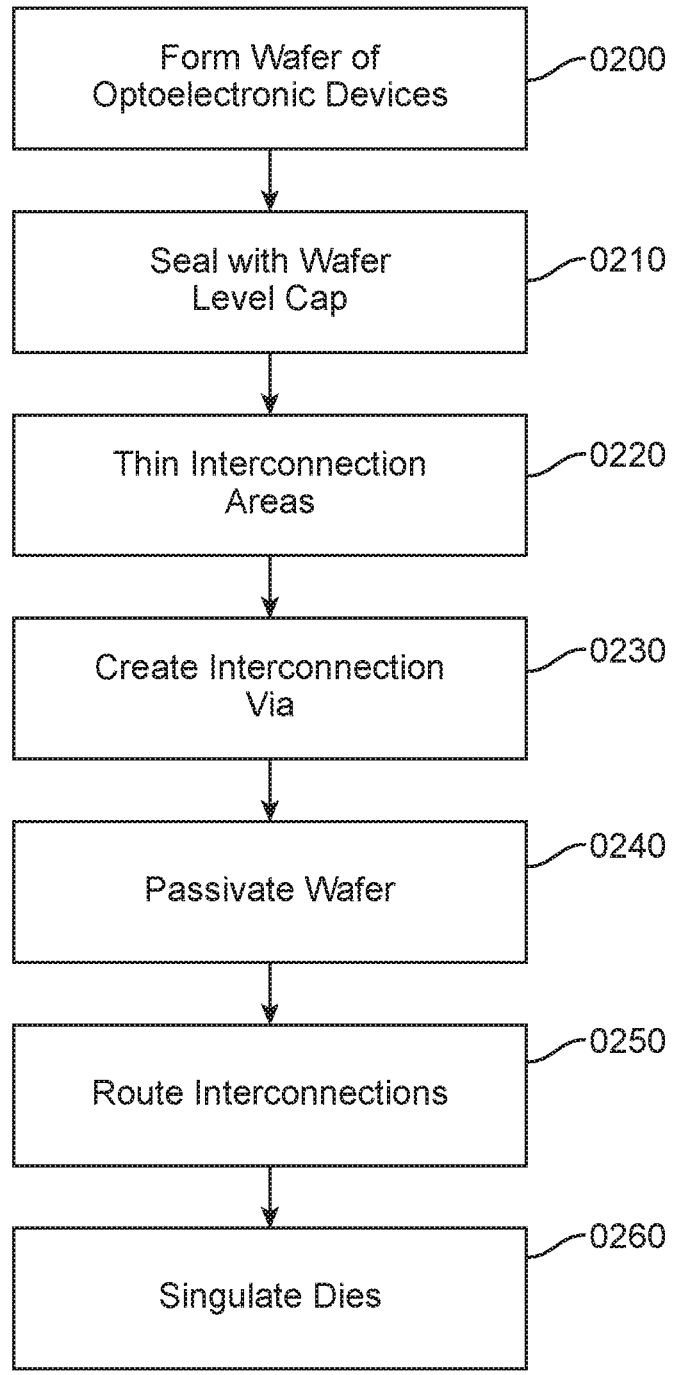
FIG. 8 illustrates a flowchart of a method for manufacturing the optoelectronic device of FIG. 1.

FIG. 8 illustrates a flowchart of a method of creating the optoelectronic chip 200 on a wafer level according to an example embodiment. FIGS. 9 to 14 illustrate perspective views in stages of the method of FIG. 8. It is noted that while a wafer 280 accommodates a plurality of optoelectronic devices 202, FIGS. 9 to 14 only illustrate a portion of the wafer 280 that corresponds to a single optoelectronic device 202 for clarity.

Figure 9:
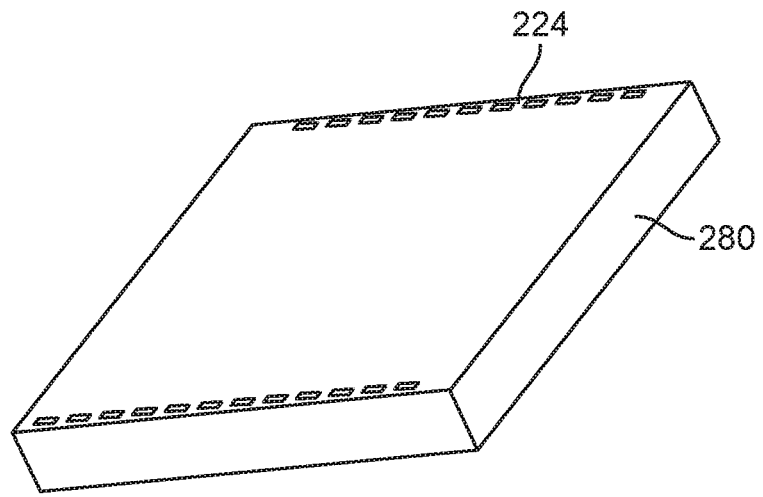
FIGS. 9 to 14 illustrate perspective views of stages of the method of FIG. 8.
Figure 10:
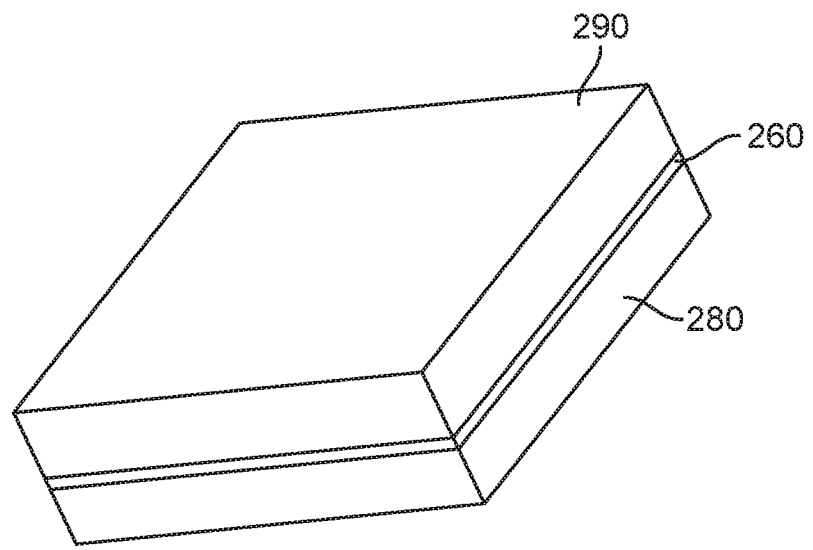

First, in operation o200, a wafer 280 having a plurality of optoelectronic devices 202 and contacts pads 224 thereon may be formed, as illustrated in FIG. 9. Then the wafer 280 may be secured with a cap wafer 290 in operation o210, as illustrated in FIG. 10, e.g., using a sealing wafer 260 or by providing the bonding material 230 around each optoelectronic device. The wafer 280 may ultimately provide the substrate 204, the associated optoelectronic device 202, and the electrical interconnections 220. The cap wafer 290 may form the cap 206 covering the device. The cap wafer 290 may include a plurality of recesses 207 corresponding the optoelectronic devices 202, while the sealing wafer 260 may include openings 237 corresponding thereto.

Figure 11:
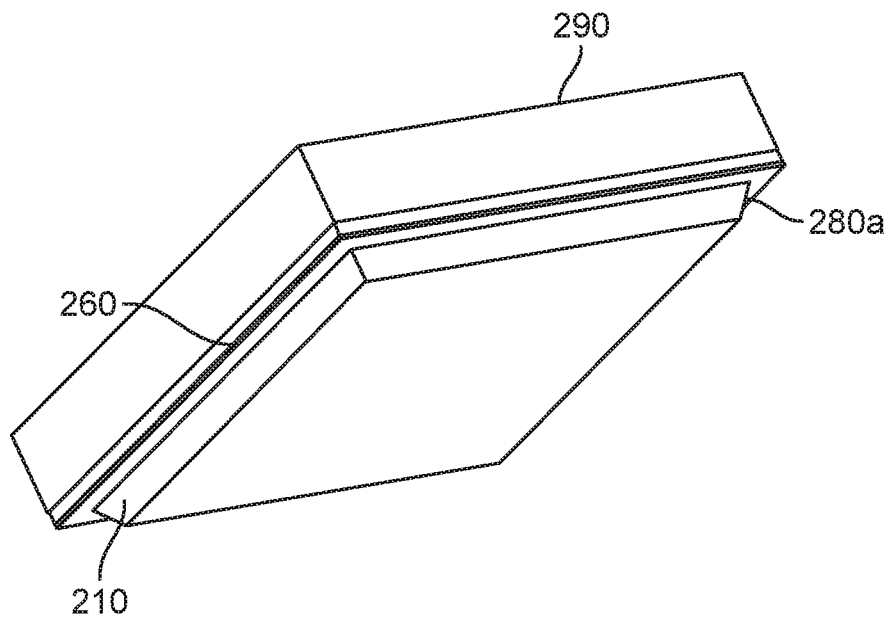

Then, in operation o220, interconnection areas at the backside of the wafer 280 may be selectively thinned adjacent each optoelectronic device 202, resulting in the third surface 204c and the tapered sidewalls 210 of a wafer 280a, as shown in FIG. 11. The wafer 280a may include sets of contact pads 224 at the cap facing surfaces for each optoelectronic device 202.

Figure 12:
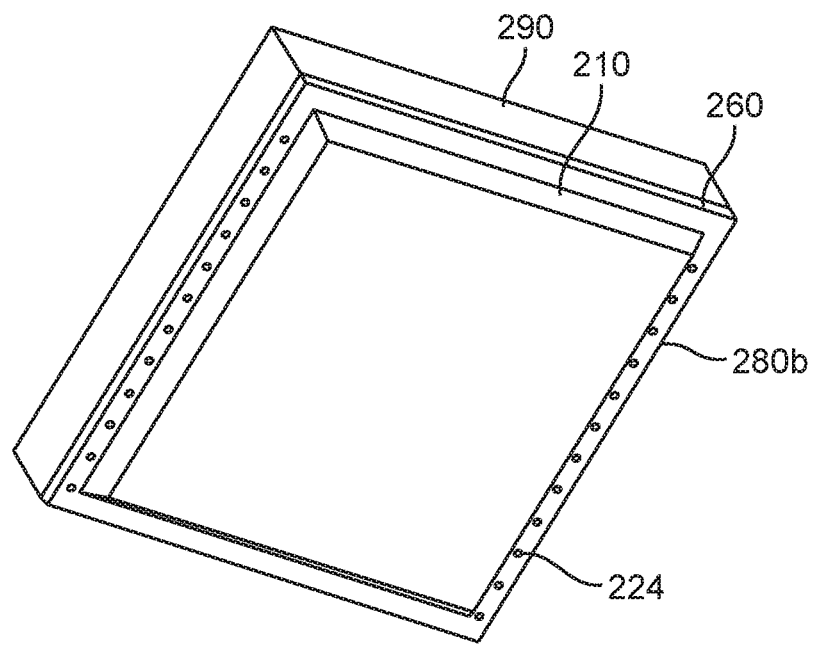

Then, in operation o230, selected portions of the thinned section may be removed e.g., ion etched or laser-drilled, to form vias to allow access to the contact pads 224 on the second surface 204b of a wafer 280b, as shown in FIG. 12. By thinning the interconnection areas of the wafer through etching, the thickness of the region where the through-silicon contact is created is reduced. This simplifies the via process and provides higher yields and good electrical contacts. Providing angled sidewalls allows the subsequent electrical traces to be routed from the contact vias up to surface where the BGA is created.

Figure 13:
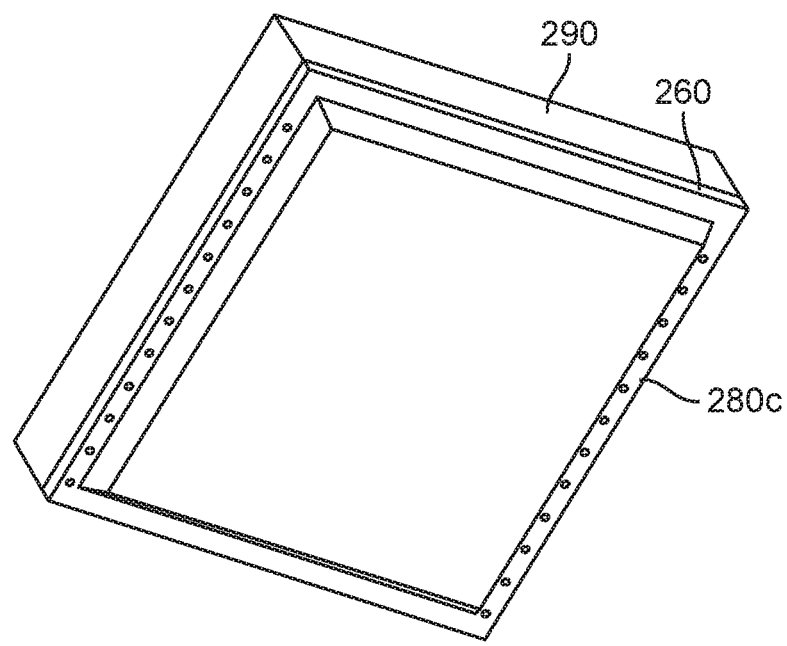
Figure 14:
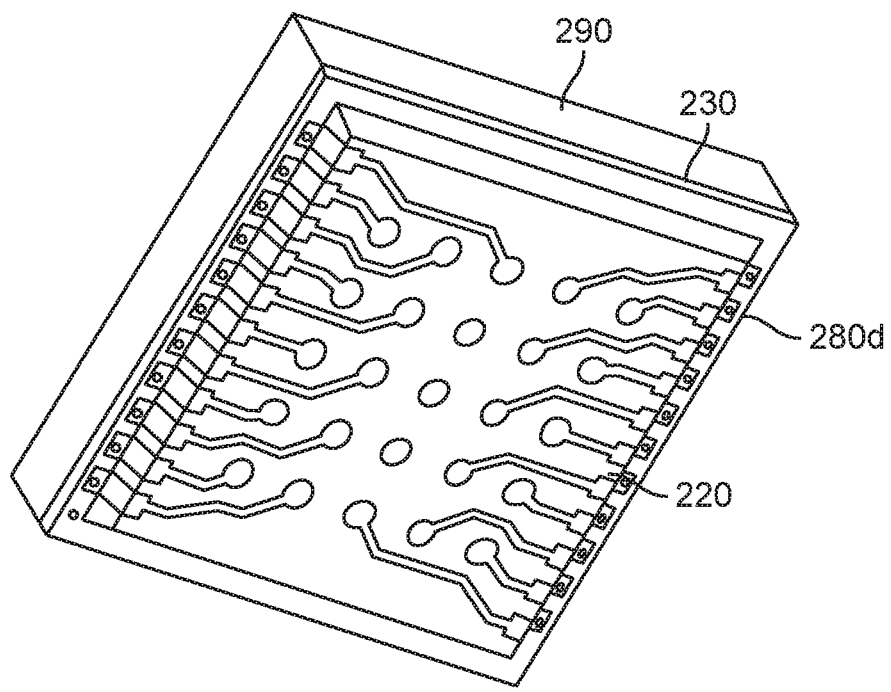

In operation o240, a backside of the wafer 280b may be passivated while leaving the vias in connection with the contacts 224 exposed to form a wafer 280c, as shown in FIG. 13. Using lithography and metal deposition or metal printing, the electrical interconnections 220 are created from the via locations at the contact pads, up the sloped sidewalls, to the BGA pad locations. The remainder of the electrical interconnections 220, i.e., the BGA pads 226 and the interconnects 222 may be routed along the backside of the wafer 280c to form a wafer 280d, as shown in FIG. 14. Then, the wafer may be singulated to form the optoelectronic chip 200 shown in FIGS. 7A to 7D.

Figure 15:
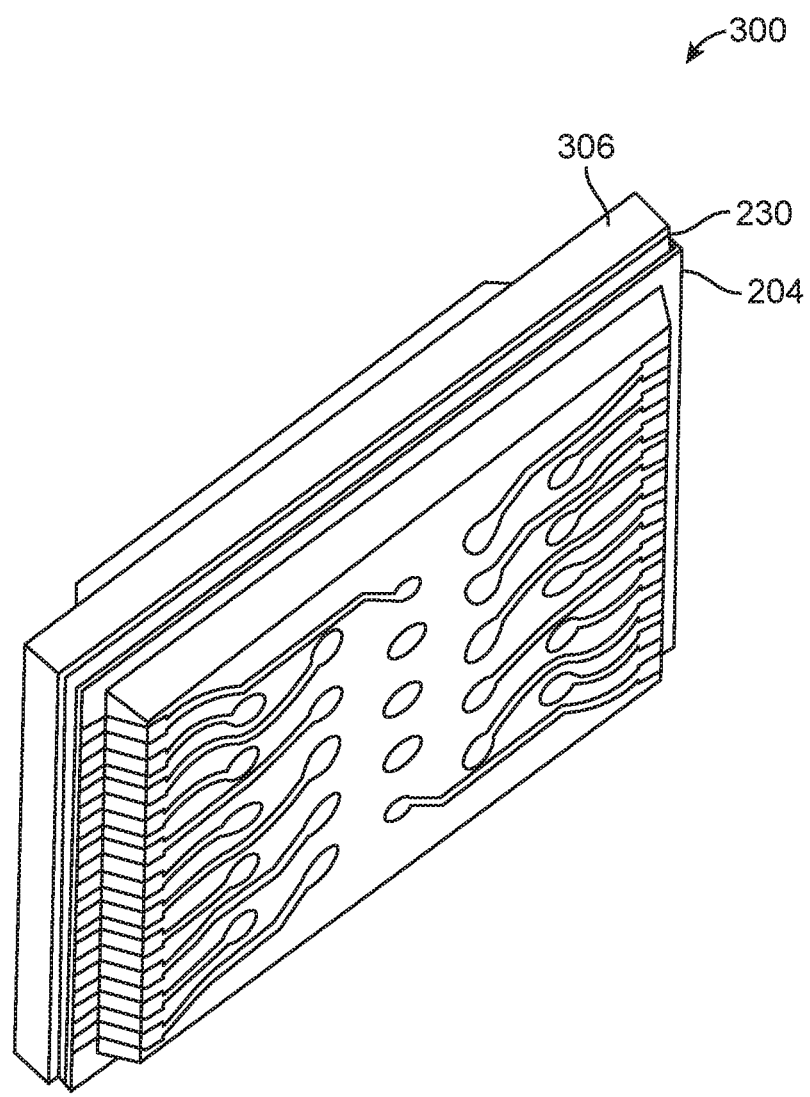
FIG. 15 illustrates a perspective view of an optoelectronic device according to an embodiment.

FIG. 15 illustrates an optoelectronic device 300 in accordance with an embodiment. The optoelectronic device 300 is substantially the same as the optoelectronic device 200, except with respect to the cap 306, as discussed in detail below.

Figure 16:
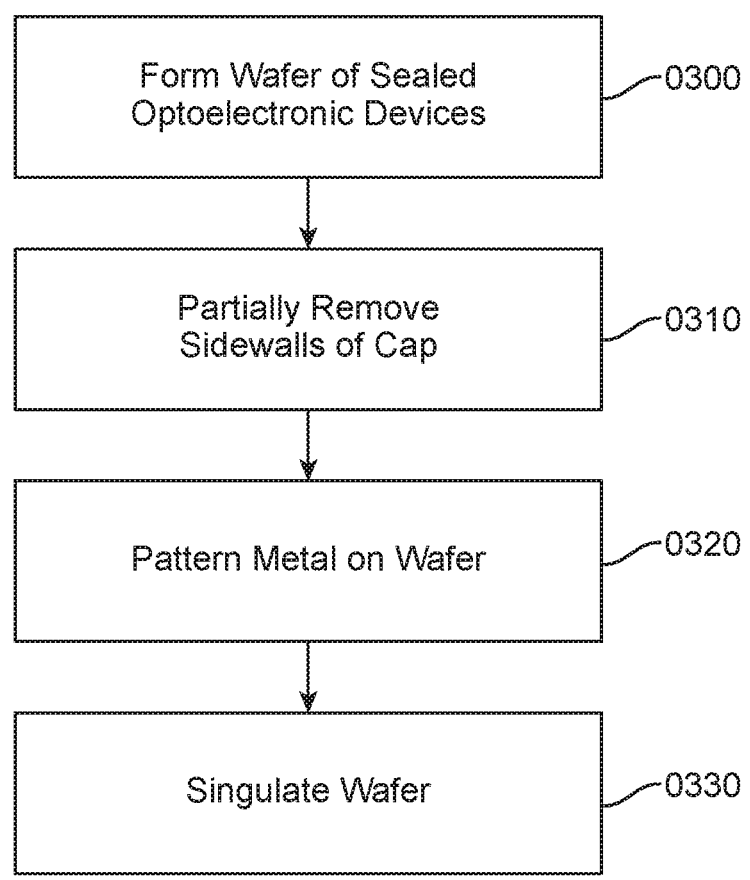
FIG. 16 illustrates a flowchart of a method for manufacturing the optoelectronic device of FIG. 1.
Figure 18:
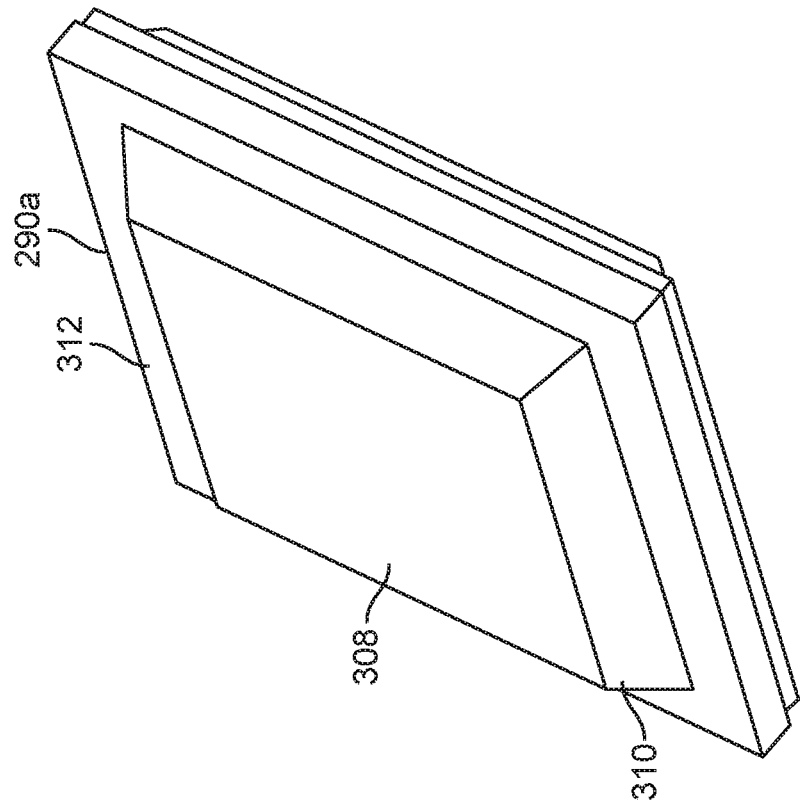
FIGS. 17 to 19 illustrate perspective views of stages of the method of FIG. 16.
Figure 17:
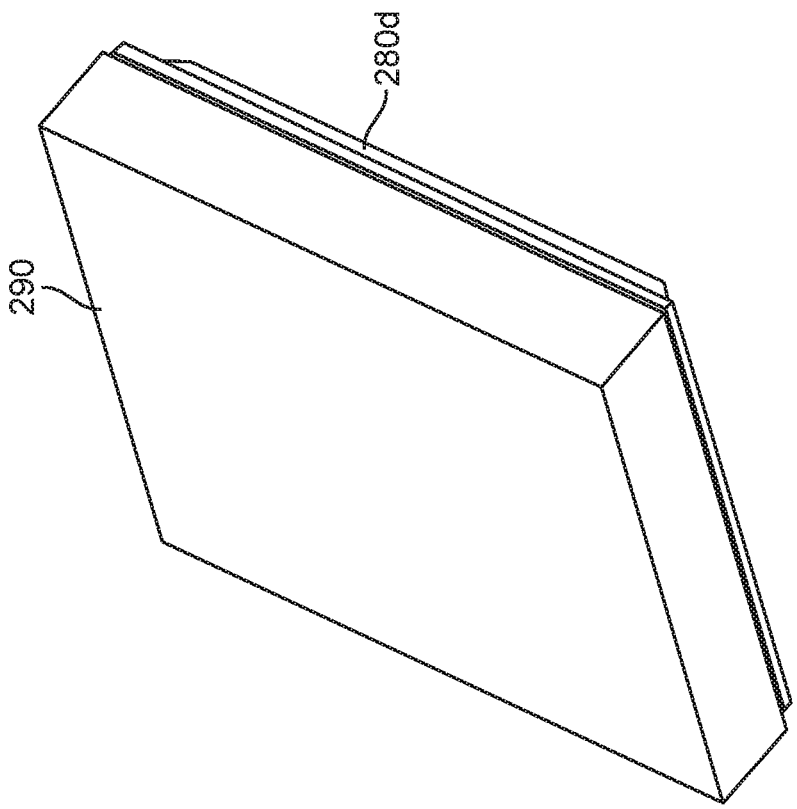
Figure 19:
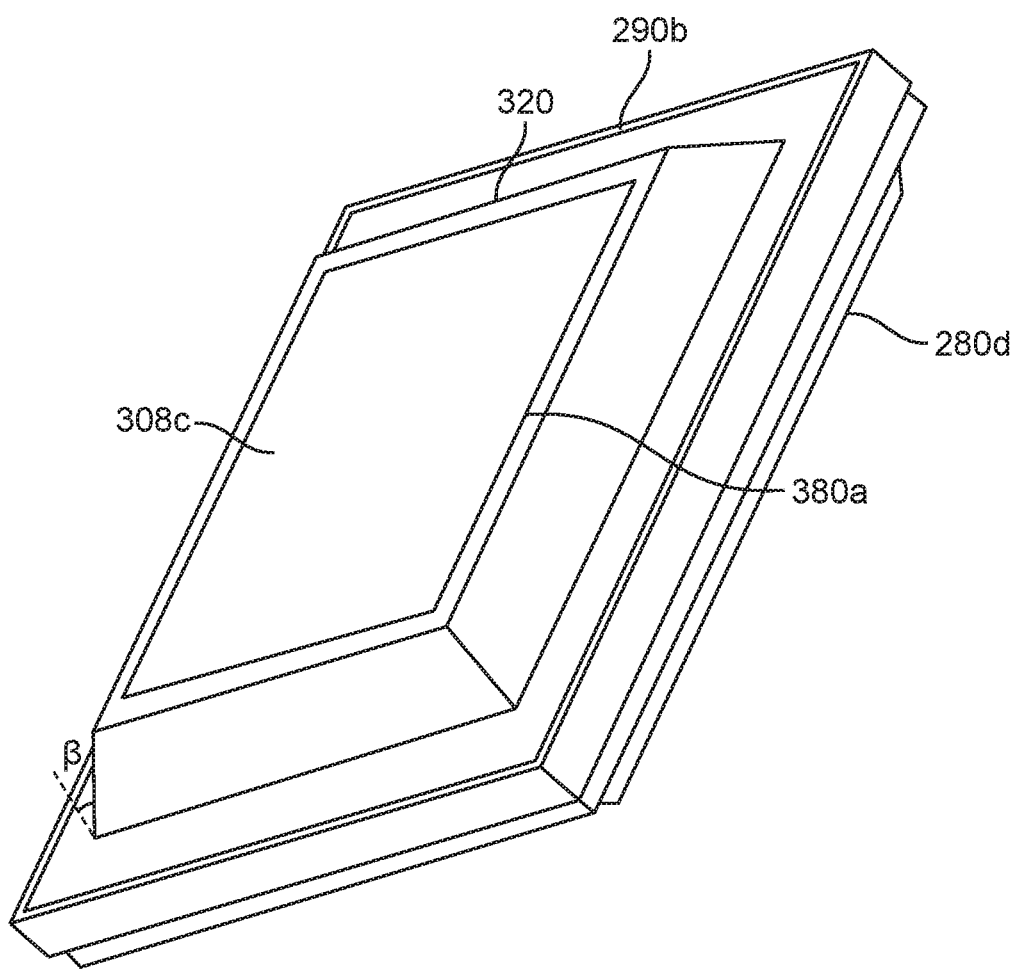

FIG. 16 illustrates a method of creating the optoelectronic chip 300 on a wafer level according to an example embodiment. FIGS. 17 to 19 illustrate perspective views in stages of the method of FIG. 16. It is noted that while the wafer 280d accommodates a plurality of optoelectronic devices 202, FIGS. 17 to 19 only illustrate a portion of the wafer 280 that corresponds to a single optoelectronic device 202 for clarity.

First, in operation o300, a wafer of sealed optoelectronic device may be formed, e.g., using operations o200 to o250, as shown in FIG. 17. Then, in operation o310, the cap wafer 290 may be partially removed, e.g., with a beveled dicing blade or etching, around a perimeter of the optoelectronic devices 202. While the tapered sidewalls 310 illustrated herein only partially extend through the cap wafer 290, leaving a planar cap portion 312, forming a wafer 290a, they could extend all the way through the cap wafer 290. For example, the tapered sidewalls 310 may have relieved edges, here, angled edges such that, other than the planar cap portion 312, the cap 306 has a frustum shape. The angle β (as determined relative to the planar cap portion 312 or the z axis) may be greater than 0 and less than 90 degrees, e.g., about 15 degrees, about 30 degrees, about 45 degrees, or about 6 degrees, and may be different from the angle α of the sidewall 210 of the wafer 280d.

Then, in operation o320, a material 320 that is opaque to light to be used by the optoelectronic device 202, e.g., metal, may be patterned on the cap wafer 290a to form a cap wafer 290b. For example, the material 320 may be provided on the sidewalls 310 and on lower planar portions 312, as well as on a perimeter portion 308a. A central portion 308c of the cap 306 may remain uncovered. Then, in operation o330, the dies may be singulated to form the optoelectronic chip of FIG. 15.

By way of summation and review, using a tapered cap and/or a tapered optoelectronic substrate to expose a contact pad, and having electrical interconnects being routed along the tapered surfaces between a contact pad and an interconnect may enable miniaturization and reduced costs. Use of such a structure may allow the cap to be made of a material that is transparent to wavelengths for use with the optoelectronic device, while providing electrical connections therealong, as well as on a surface of the cap, may allow these to be provided on a wafer level, while blocking some stray light.

Further, method of creating such a structure as disclosed above may allow use of a single singulation, e.g., dicing, operation for packages that include both a cap and a substrate for the optoelectronic device. Particularly, manufacturing of optoelectronic device packages for use with TIR light typically require more than one dicing operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An optoelectronic device package, comprising:
an optoelectronic device on a substrate, the substrate having a first surface and a second surface, opposite the first surface along an optical path in the package, the optoelectronic device having an active region on the first surface, the substrate having a bond pad area on the first surface that includes at least one contact pad electrically connected to the active region;
a cap having a first cap surface and a second cap surface, opposite the first cap surface along the optical path, the first cap surface being secured to the first surface of the substrate, the cap covering the optoelectronic device, wherein the active region is for use with light passing through the cap;
at least one of the cap and the substrate having an angled sidewall extending at an angle, the angle being greater than 0 and less than 90 degrees relative to an axis parallel to the optical path, and also having a straight sidewall; and
the at least one contact pad being exposed by and adjacent to the angled sidewall; and
an electrical line extending from each of the at least one contact pad along the angled sidewall and to the second cap surface that does not overlap the active region.

2. The package as claimed in claim 1, wherein the active region is for use with thermal infrared (TIR) light, the cap is transparent to TIR light, and the electrical line is opaque to TIR.

3. The package as claimed in claim 1, wherein the cap includes the angled sidewall.

4. The package as claimed in claim 3, further comprising:
at least one interconnect on the second cap surface, wherein the electrical line extends from the at least one interconnect to the at least one contact pad along the angled sidewall.

5. The package as claimed in claim 4, wherein the at least one interconnect is secured to a printed circuit board (PCB), and the active region is for use with light passing through the cap and an opening in the PCB.

6. The package as claimed in claim 1, wherein the substrate includes the angled sidewall.

7. The package as claimed in claim 5,
wherein the at least one interconnect comprises a ball grid array interconnect.

8. The package as claimed in claim 1, wherein the electrical line is opaque to light used by the optoelectronic device.

9. The package as claimed in claim 1, wherein the second cap surface includes a central portion overlapping the optoelectronic device, an angled sidewall portion comprising the angled sidewall, and a planar portion connected to the central portion by the angled sidewall portion.

10. The package as claimed in claim 9, further comprising an opaque material on the angled sidewall portion and the planar portion of the second cap surface.

11. A method of manufacturing an optoelectronic device package, comprising:
providing a first wafer having a plurality of optoelectronic devices, the first wafer having a first surface and a second surface, opposite the first surface along an optical path in the package, the second surface including at least one contact pad for each optoelectronic device and an active region for use with infrared light for each optoelectronic device;
securing a second wafer to the first wafer, the second wafer having a third surface and a fourth surface, opposite the fourth surface along the optical path in the package, the second surface of the first wafer being secured to the third surface of the second wafer, the second wafer sealing the optoelectronic device, the second wafer being transparent to infrared light;
forming a plurality of angled sidewalls extending at an angle relative to an axis parallel to the optical path, the angle being greater than 0 and less than 90 degrees in at least one of the first surface of the first wafer and the fourth surface of the second wafer, the plurality of angled sidewalls corresponding to the plurality of optoelectronic devices, the at least one contact pad of each optoelectronic device being exposed by and adjacent to the angled sidewall, wherein the second wafer provides a plurality of caps each of which covers a respective one of the optoelectronic devices, and each active region is for use with light passing through the respective cap; and for each optoelectronic device, forming an electrical line extending from each of the respective at least one contact pad along a respective one of the angled sidewalls and to the fourth surface that does not overlap the respective active region, the electrical line being opaque to infrared light.

12. The method as claimed in claim 11, wherein forming the plurality of angled sidewalls includes removing a portion of fourth surface of the second wafer to expose the at least one contact pad of each of the plurality of optoelectronic devices on the first wafer.

13. The method as claimed in claim 12, further comprising:

for each optoelectronic device, forming at least one interconnect on the fourth surface, wherein the respective electrical line extends from the at least one interconnect to the respective at least one contact pad along the respective angled sidewall.

14. The method as claimed in claim 13, further comprising, for at least one optoelectronic device, securing the at least one interconnect to a printed circuit board (PCB), and wherein the respective active region is for use with light passing through the respective cap and an opening in the PCB.

15. The method as claimed in claim 11, wherein forming the plurality of angled sidewalls includes removing a portion of the first wafer to expose the at least one contact pad of each of the plurality of optoelectronic devices on the first wafer.

16. The method as claimed in claim 15, further comprising:

forming at least one interconnect for each of the optoelectronic devices on the fourth surface of the second wafer, wherein the electrical line extends from the at least one interconnect to the at least one contact pad along the angled sidewall.

17. The method as claimed in claim 16, wherein each electrical line is opaque to light used by the respective optoelectronic device, and the at least one interconnect comprises a ball grid array interconnect.

18. The method as claimed in claim 17, further comprising partially removing the second wafer such that at each cap, the fourth surface includes a central portion overlapping the respective optoelectronic device, an angled sidewall portion comprising the angled sidewall, and a planar portion connected to the central portion by the angled sidewall portion.

19. The method as claimed in claim 18, further comprising providing an opaque material on the angled sidewall portion and the planar portion.

20. An optoelectronic device package, comprising:

an optoelectronic device on a substrate, the substrate having a first surface and a second surface, opposite the first surface along an optical path in the package, the optoelectronic device having an active region for use with thermal infrared (TIR) light on the first surface, the substrate having a bond pad area on the first surface that includes at least one contact pad electrically connected to the optoelectronic device, the substrate having an angled sidewall extending at an angle, the angle being greater than 0 and less than 90 degrees relative to an axis parallel to the optical path, and also having a straight sidewall, the at least one contact pad being exposed by and adjacent to the angled sidewall;

a cap having a first cap surface and a second cap surface, opposite the first cap surface along the optical path, the first cap surface being secured to the first surface of the substrate, the cap covering the optoelectronic device, the cap being transparent to TIR light, wherein the active region is for use with light passing through the cap; and an electrical line extending from each of the at least one contact pad along the angled sidewall and to the second surface of the substrate, the electrical line being opaque to TIR.

* * * * *